(12) United States Patent
Huang

(10) Patent No.: US 6,795,493 B1
(45) Date of Patent: Sep. 21, 2004

(54) CIRCUIT FOR A TRANSCEIVER OUTPUT PORT OF A LOCAL AREA NETWORKING DEVICE

(75) Inventor: Chen-chih Huang, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 09/447,709

(22) Filed: Nov. 23, 1999

(51) Int. Cl.$^7$ ................................................. H02J 1/10
(52) U.S. Cl. .................. 375/219; 307/43; 307/401; 307/71; 326/62; 326/82; 326/30; 327/108
(58) Field of Search ........................... 327/108; 326/62, 326/82, 30, 86; 307/401, 412, 71, 43, 53, 64, 65, 44; 375/219

(56) References Cited

U.S. PATENT DOCUMENTS

| | | | | |
|---|---|---|---|---|
| 5,081,423 A | * | 1/1992 | Koyama et al. | 327/341 |
| 5,436,934 A | * | 7/1995 | Co | 375/317 |
| 5,818,269 A | * | 10/1998 | Brown et al. | 327/108 |
| 6,121,793 A | | 9/2000 | Pickering et al. | 326/73 |
| 6,215,816 B1 | | 4/2001 | Gillespie et al. | 375/219 |
| 6,313,670 B1 | | 11/2001 | Song et al. | 327/108 |
| 6,393,062 B1 | | 5/2002 | Furman et al. | 375/252 |
| 6,411,647 B1 | * | 6/2002 | Chan | 375/216 |

* cited by examiner

Primary Examiner—Temesghen Ghebretinsae
Assistant Examiner—Pankaj Kumar
(74) Attorney, Agent, or Firm—Thomas, Kayden, Horstemeyer & Risley

(57) ABSTRACT

A circuit for a transceiver output port of a local area networking device is provided and includes a first and a second current source coupled to the ground, a first and a second resistor coupled to the supply voltage, wherein the resistances of the first and the second resistors each are equal to half that of the equivalent resistance of the UTP cable for the purpose of impedance matching, and a third current source and a fourth current source coupled to the UTP cable for providing additional current for the circuit. The magnitude of the differential signal output from the circuit can thus sustain in a predetermined range even if the magnitude of the supply voltage is lower than the minimum magnitude required by the conventional circuit.

20 Claims, 4 Drawing Sheets

CIRCUIT FOR A TRANSCEIVER OUTPUT PORT OF A LOCAL AREA NETWORKING DEVICE

BACKGROUND OF THE INVENTION

A. Field of the Invention

The present invention relates to a circuit for a transceiver output port of a local area networking device, especially to a circuit for a transceiver output port which is operable at low supply voltage and can output a differential signal for an Ethernet networking device.

B. Description of the Prior Art

The IEEE develops a twisted-pair standard for 10 Mbps Ethernet called 10 BASE-T. 10 BASE-T Ethernet has a star wiring configuration and a UTP cable which connects each workstation to a central hub. According to the IEEE 802.3 Ethernet standard, the peak voltage for a transceiver output port ranges from ±2.2V to ±2.8V. In other words, the differential signal $V_{PP}$ of the transceiver output port ranges from 4.4V to 5.6V as illustrated in FIG. 1. The differential signal of the transceiver output port 21 is transmitted to a twisted-pair cable 22 via the transformer 23, as illustrated in FIG. 2.

Referring to FIG. 3, which shows a conventional circuit of a transceiver output port for communicating with the UTP cable. It includes two current sources: $I_1$ and $I_2$ which are series-connected to the resistors $R_1$ and $R_2$ respectively. The other ends of the resistors $R_1$ and $R_2$ are connected to a common supply voltage $V_{DD}$. A differential voltage $(V^+ - V^-)$ appears between the nodes x and y, which have voltages $V^+$ and $V^-$ respectively. An equivalent load resistance $R_L$ appears between the nodes x and y.

The advantage for the circuit as illustrated in FIG. 3 is that electricity can be saved while the circuit is in idle state. When there is no signal output from the transceiver output port (the transceiver output port is idle), the current sources $I_1$, $I_2$ can be completely opened in order to save electricity. However, due to the inductance of the transformer coil, it takes a period of time for the transformer coil to be fully charged every time after the current sources $I_1$, $I_2$ are closed. The time required is determined by the inductance value of the transformer coil and the resistors $R_1$, $R_2$. Consequently, for the purpose of suppressing the time delay as mentioned in the above, the current sources $I_1$, $I_2$ cannot be completely opened even in idle state in practical application.

Although the circuit as shown in FIG. 3 can save electricity, it is not applicable under low supply voltage, which is explained as follows. Referring to FIG. 3, assume $R_L$ is the equivalent load resistance of the UTP cable, and $R_1$ and $R_2$ are the bias resistors for matching impedance. Generally, the following expression holds: $R_L = 2R_1 = 2R_2 = 100\Omega$. Therefore, the resistors $R_1$ and $R_2$ can both be represented as R; $R_L$ can be represented as 2R, respectively. Accordingly, the following equations can be derived:

$$I_1 + I_2 = I \quad (1)$$

$$\frac{V_{DD} - V^-}{R} + \frac{V^+ - V^-}{2R} = I_1 \quad (2)$$

$$\frac{V_{DD} - V^+}{R} - \frac{V^+ - V^-}{2R} = I_2 \quad (3)$$

wherein I is a constant.

From the equations (2) and (3), equation (4) can be derived as follows:

$$\Rightarrow \frac{2V_{DD} - (V^+ + V^-)}{R} = I \quad (4)$$

$$\Rightarrow V^+ + V^- = 2V_{DD} - RI$$

$$\Rightarrow V^- = 2V_{DD} - RI - V^+$$

Substitute equation (2) into equation (4) to obtain equation (5) as follows.

$$\Rightarrow \frac{2V_{DD} - 2(2V_{DD} - RI - V^+) + V^+ - (2V_{DD} - RI - V^+)}{2R} = I_1 \quad (5)$$

$$\Rightarrow -4V_{DD} + 4V^+ + 3RI = 2RI_1$$

Substitute equation (1) into equation (5) to obtain equation (6) as follows.

$$\Rightarrow V^+ = V_{DD} - \frac{1}{4}RI_1 - \frac{3}{4}RI_2 \quad (6)$$

Furthermore, substitute equation (4) into equation (6) to obtain equation (7) as lows.

$$\Rightarrow V^- = V_{DD} - \frac{3}{4}RI_1 - \frac{1}{4}RI_2 \quad (7)$$

From equations (6) and (7), $$\Rightarrow V^+ - V^- = \frac{R}{2}(I_1 - I_2) \quad (8)$$

When the differential signal is positive $(V^+ > V^-)$, we can derive an equation (9) from the equation (8).

$$2.2 \le V^+ - V^- = \frac{R}{2}(I_1 - I_2) \le 2.8 \quad (9)$$

$$\Rightarrow \frac{4.4}{R} + I_2 \le I_1 \le \frac{5.6}{R} + I_2$$

From equation (7), $$V^- = V_{DD} - \frac{3}{4}RI_1 - \frac{1}{4}RI_2 \ge 0 \quad (10)$$

$$\Rightarrow V_{DD} \ge \frac{R}{4}(3I_1 + I_2)$$

Substitute equation (9) into equation (10).

$$V_{DD} \ge \frac{R}{4}\left(3 \times \frac{4.4}{R} + 3I_2 + I_2\right) = 3.3 + RI_2$$

As a result, the supply voltage VDO has a minimum value of 3.3V when $I_2=0$. Therefore, the supply voltage $V_{DD}$ cannot be further reduced if the same amplitude of output signal is to be kept. This is a disadvantage for designing a circuit operable at low supply voltage.

SUMMARY OF THE INVENTION

To solve the above-mentioned problem, the present invention provides a circuit for a transceiver output port of a local networking device which is operable at low supply voltage and can output a differential signal for an Ethernet networking device. The circuit of the present invention includes four current sources. The first current source has a first terminal connected to ground and a second terminal connected to one terminal of a first resistor. The other terminal of the first resistor is connected to a supply voltage. A second current source has a first terminal connected to ground and a second terminal connected to one terminal of a second resistor. The other terminal of the second resistor is connected to the supply voltage. The resistance values of the first resistor and the second resistor are both equal to ½ that of the UTP cable for the purpose of impedance matching. In addition, a third current source and a fourth current source connect to the first resistor and the second resistor in parallel. In other words, the third current source is coupled between the first current source and the supply voltage while the fourth current source is coupled between the second current source and the supply voltage. As a result, the third current source and the fourth current source provide additional current which sustains a predetermined amplitude of differential signals output from the circuit. In this way, the supply voltage can be reduced as much as possible to a minimum value required to ensure proper operation of the four current sources.

BRIEF DESCRIPTION OF THE DRAWINGS

These and other objects and advantages of the present invention will become apparent with reference to the following description and accompanying drawings wherein.

DETAILED DESCRIPTION OF THE PREFERRED EMBODIMENTS

A preferred embodiment of the invention is described below. Those skilled in the art will appreciate that modifications can be made to the disclosed embodiment without departing from the spirit and scope of the invention.

Figure 1:
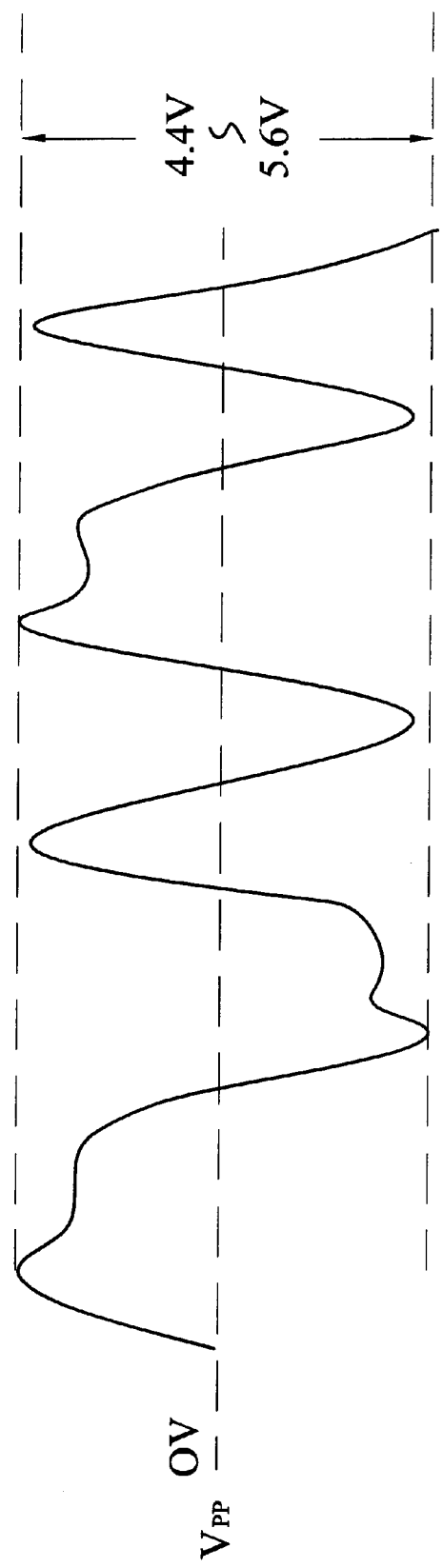
FIG. 1 a diagram showing the variation of a differential signals $V_{pp}$ of the transceiver output port according to 10BASE-T standard.
Figure 2:
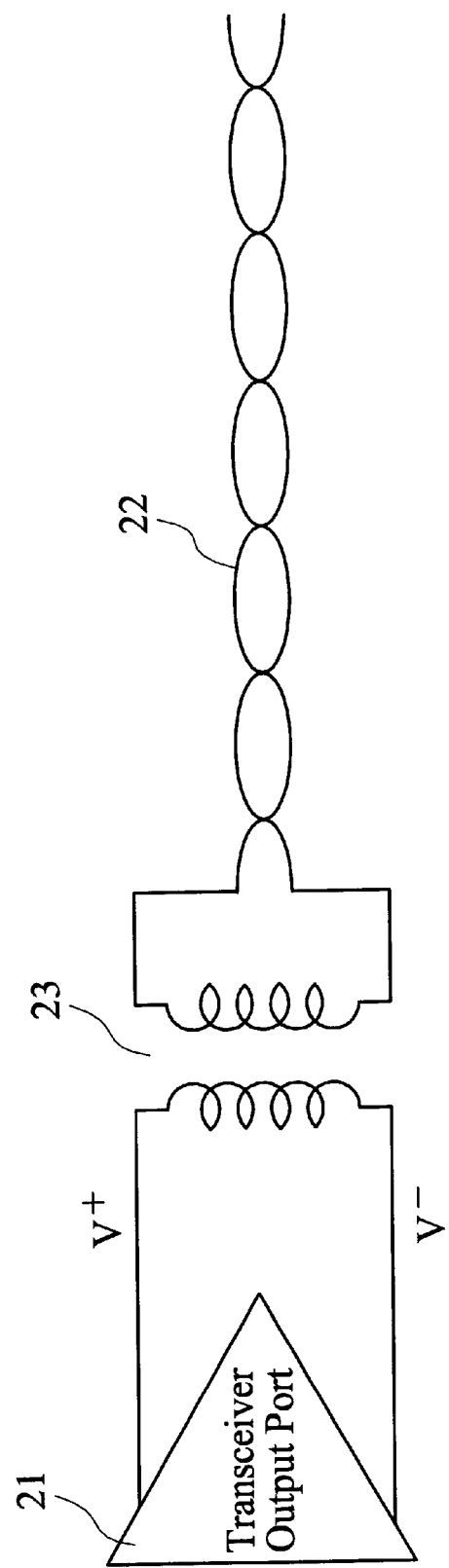
FIG. 2 is a schematic diagram showing the structure of the transceiver output port when connected to a UTP cable via a transformer.
Figure 3:
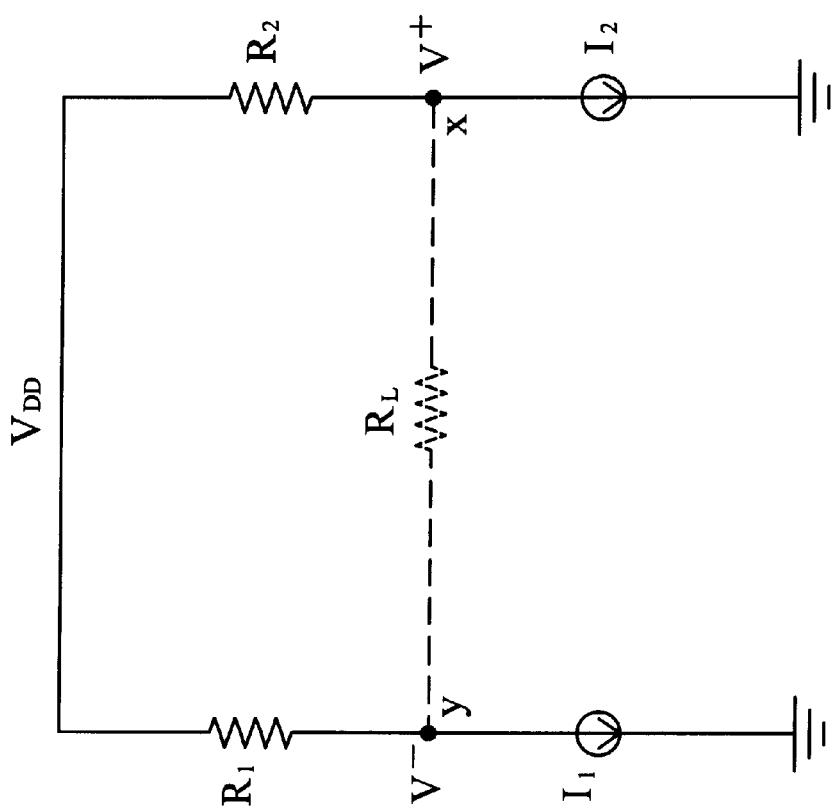
FIG. 3 is a circuit diagram showing the conventional transceiver output port for a local area networking device.
Figure 4:
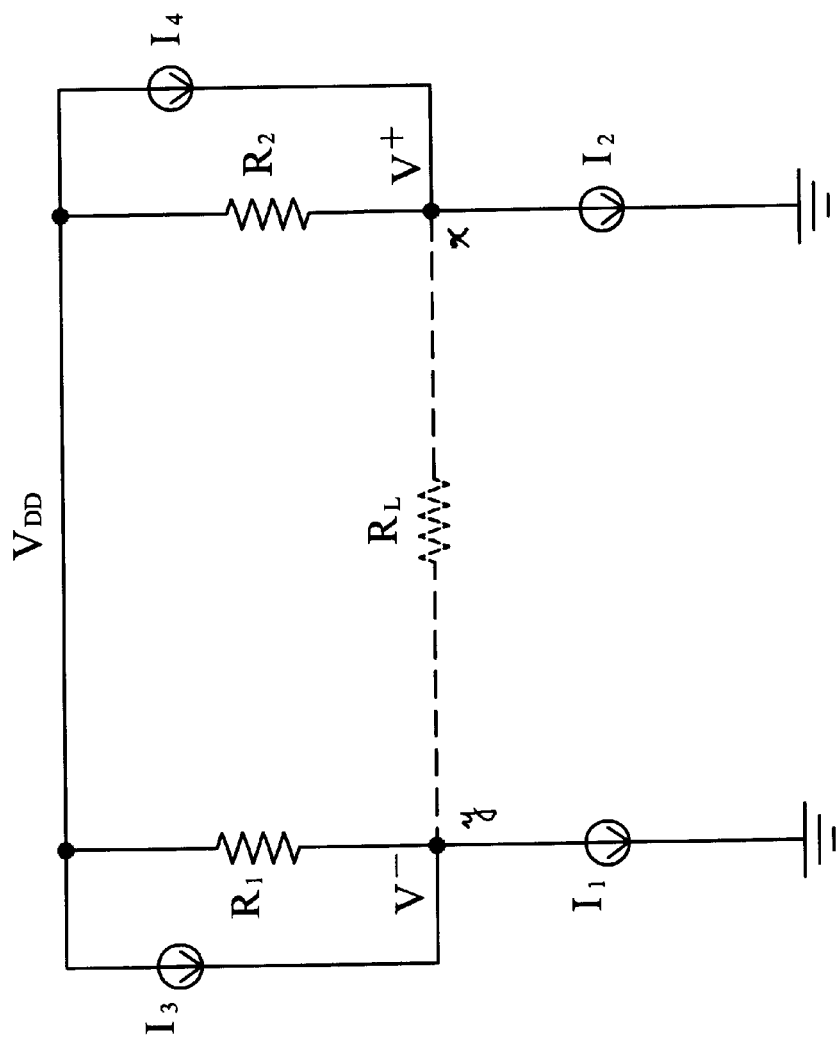
FIG. 4 is a circuit diagram showing the transceiver output port according to a preferred embodiment of the present invention.

Referring to FIG. 4, the circuit is similar to the conventional circuit as illustrated in FIG. 3 except that two current sources $I_3$ and $I_4$ are added thereto. The circuit includes four current sources $I_1$~$I_4$. The first terminal and second terminal of the current source $I_1$ are connected to ground and one terminal of a resistor $R_1$ respectively. The other terminal of the resistor $R_1$ is connected to a supply voltage $V_{DD}$. The first terminal and second terminal of the current source $I_2$ are connected to ground and one terminal of a resistor $R_2$ respectively. The other terminal of the resistor $R_2$ is connected to the supply voltage $V_{DD}$. The resistance values of the resistors $R_1$ and $R_2$ are also bias resistors for the purpose of impedance matching. The equivalent load resistance between the nodes x and y is $R_L$.

The current sources $I_3$ and $I_4$ are connected to the resistors $R_1$ and $R_2$ in parallel respectively. In other words, the current source $I_3$ is coupled between the current source $I_1$ and the supply voltage $V_{DD}$ while the current source $I_4$ is coupled between the current source $I_2$ and the supply voltage $V_{DD}$.

The current sources $I_3$ and $I_4$ provide additional current which sustains a predetermined amplitude of differential signals output from the circuit. In this way, the supply voltage $V_{DD}$ can be reduced as much as possible to a minimum value required to ensure proper operation of the four current sources $I_1$~$I_4$.

Generally, the following expression holds: $R_L=2R_1=2R_2=100\Omega$. Therefore, the resistors $R_1$ and $R_2$ can both be represented as R; $R_L$ can be represented as 2R, respectively. The advantage of the circuit as shown in FIG. 4 can be explained more clearly from the following equations:

$$I_1 + I_2 = I_{12} \quad (11)$$

$$I_3 + I_4 = I_{34} \quad (12)$$

wherein, $I_{12}$ and $I_{34}$ are two constants.

$$\frac{V_{DD} - V^-}{R} + I_3 + \frac{V^+ - V^-}{2R} = I_1 \quad (13)$$

$$\frac{V_{DD} - V^+}{R} + I_4 + \frac{V^+ - V^-}{2R} = I_2 \quad (14)$$

Summing up equation (13) and (14):

$$\Rightarrow \frac{2V_{DD} - (V^+ + V^-)}{R} = I_1 + I_2 - I_3 - I_4 = I_{12} - I_{34} \quad (15)$$

$$\Rightarrow V^+ + V^- = 2V_{DD} - R(I_{12} - I_{34})$$

$$\Rightarrow V^- = 2V_{DD} - R(I_{12} - I_{34}) - V^+$$

Substitution (15) into equation (13) to yield equation (16):

$$2V_{DD} - 2[2V_{DD} - R(I_{12} - I_{34}) - V^+] + V^+ - \quad (16)$$

$$\Rightarrow \frac{[2V_{DD} - R(I_{12} - I_{34}) - V^+]}{2R} = I_1 - I_3$$

$$\Rightarrow -4V_{DD} + 4V^+ + 3RI_{12} - 3RI_{34} = 2RI_1 - 2RI_3$$

Moreover, equations (11) and (12) into equation (16):

$$\Rightarrow V^+ = V_{DD} - \frac{1}{4}RI_1 - \frac{3}{4}RI_2 + \frac{1}{4}RI_3 + \frac{3}{4}RI_4 \quad (17)$$

Moreover, substitute equation (17) into equation (15):

$$\Rightarrow V^- = V_{DD} - \frac{3}{4}RI_1 - \frac{1}{4}RI_2 + \frac{3}{4}RI_3 + \frac{1}{4}RI_4 \quad (18)$$

According to equations (17) and (18), $$\Rightarrow V^+ - V^- = \frac{R}{2}[(I_1 - I_2) - (I_3 - I_4)] \quad (19)$$

When the differential signal is positive ($V^+>V^-$), according to equation (19), $$2.2 \leq V^+ - V^- = \frac{R}{2}[(I_1 - I_2) - (I_3 - I_4)] \leq 2.8 \quad (20)$$

$$\Rightarrow \frac{4.4}{R} + I_2 - I_4 \leq I_1 - I_3 \leq \frac{5.6}{R} + I_2 - I_4$$

According to equation (18), $$\Rightarrow V^- = V_{DD} - \frac{3}{4}R(I_1 - I_3) - \frac{1}{4}R(I_2 - I_4) \geq 0 \quad (21)$$

$$\Rightarrow V_{DD} \geq \frac{3}{4}R(I_1 - I_3) + \frac{1}{4}R(I_2 - I_4)$$

Substitute equation (20) into equation (21):

$$\Rightarrow V_{DD} \geq 3.3 + R(I_2 - I_4) \quad (22)$$

According to equation (22), if $I_2=0$, and $$I_4 = \frac{3.3}{R},$$

theoretically $V_{DD}$ can be arbitrary positive value. However, in practice, the supply voltage $V_{DD}$ must be maintained at a range which ensures the current sources $I_1$~$I_4$ to operate properly. According to experience, the circuit of the transceiver output port can satisfy the requirement as long as the value of the supply voltage $V_{DD}$ exceeds 1V. Therefore, the circuit as illustrated in FIG. 4 can sustain a predetermined amplitude for the differential signals under low supply voltage.

In summary, the circuit of the present invention provides the following advantages:

(1) It sustains a predetermined amplitude of differential signals even under low supply voltage.
(2) It does not consume the electricity when the transceiver output port is idle.
(3) The circuit is simple in structure and easy to implement, thereby manufacturing cost can be saved.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A circuit for a transceiver output port of a local area networking device, said transceiver output port communicating with an unshielded twisted pair (UTP) cable, comprising:
   a first current source having a first terminal connected to ground and a second terminal connected to one terminal of a first resistor, the other terminal of said first resistor being connected to a supply voltage;
   a second current source having a first terminal connected to ground and a second terminal connected to one terminal of a second resistor, the other terminal of said second resistor being connected to the supply voltage;
   a third current source coupled between said first current source and said supply voltage;
   a fourth current source coupled between said second current source and said supply voltage;
   wherein the resistance values of said first resistor and said second resistor each are equal to ½ that of the UTP cable for the purpose of impedance matching to the UTP cable, and
   said third and fourth current sources provide together an additional current which sustains a predetermined amplitude of a differential signal output from said circuit.

2. The circuit of claim 1, wherein said supply voltage can be reduced as low as possible to a minimum value required to ensure said first current source, said second current source, said third current source, and said fourth current source to operate properly.

3. A circuit for a transceiver output port of a local area networking device, said transceiver output port including a first output node and a second output node for communicating with an unshielded twisted pair (UTP) cable, said circuit comprising:
   a first current source coupled between the first output node and ground;
   a second current source coupled between the second output node and ground;
   a first resistor coupled to said first current source and said first output node, wherein a resistance value of said first resistor is equal to ½ that of said UTP cable for the purpose of impedance matching to the UTP cable;
   a second resistor coupled to said second current source and said second output node, wherein a resistance value of said second resistor is equal to ½ that of said UTP cable for the purpose of impedance matching;
   a third current source coupled between said first current source and said supply voltage, and between said first output node and said supply voltage;
   a fourth current source coupled between said second current source and said supply voltage, and between said second output node and said supply voltage;
   wherein the resistance values of said first resistor and said second resistor each are equal to ½ that of the UTP cable for the purpose of impedance matching, and
   said third and fourth current sources provide together an additional current to enable a differential signal produced from said first and second output nodes, to be sustained within a predetermined amplitude range from said circuit, and wherein said fourth current source is configured to supply the additional current while the second current source is operating.

4. The circuit of claim 3, wherein said supply voltage can be reduced as low as possible to a minimum value required to ensure said first current source, said second current source, said third current source, and said fourth current source to operate properly.

5. A circuit for a transceiver output port of a local area networking device, said transceiver output port communicating with an unshielded twisted pair (UTP) cable, said circuit comprising:
   first and second output nodes for providing a differential signal, wherein the differential signal is coupled to the UTP cable;
   a first current source coupled between said first output node and ground;
   a second current source coupled between said second output node and ground;
   a third current source coupled between said first output node and said supply voltage;
   a fourth current source coupled between said second output node and said supply voltage;
   a first resistor coupled to said first current source, wherein a resistance value of said first resistor is equal to ½ that of said UTP cable for the purpose of impedance matching to the UTP cable; and
   a second resistor coupled to said second current source, wherein a resistance value of said second resistor is equal to ½ that of said UTP cable for the purpose of impedance matching;

wherein said third and fourth current sources providing additional current which sustains a predetermined amplitude of said differential signal output from said first and said second output nodes, and wherein said fourth current source is configured to supply the additional current while the second current source is operating.

6. The circuit of claim 5, wherein said supply voltage can be reduced, as low as possible to a minimum value required to ensure said first current source, said second current source, said third current source, and said fourth current source to operate properly.

7. The circuit of claim 2, wherein said supply voltage is higher than 1V.

8. The circuit of claim 4, wherein said supply voltage is higher than 1V.

9. The circuit of claim 6, wherein said supply voltage is higher than 1V.

10. The circuit of claim 7, wherein said supply voltage is lower than 3.3V.

11. The circuit of claim 8, wherein said supply voltage is lower than 3.3V.

12. The circuit of claim 9, wherein said supply voltage is lower than 3.3V.

13. A circuit for a transceiver output port of a local networking device, said local networking device including first and second output nodes for communicating with an unshielded twisted pair (UTP) cable coupled between said first and second output nodes, for providing a differential signal, said circuit comprising:

a voltage source for providing a voltage;

a first current source coupled between said first output node and ground;

a second current source coupled between said second output node and ground;

a resistor unit, coupled to said UTP cable, for matching an impedance of said UTP cable;

a third current source coupled between said first output node and said voltage source;

a fourth current source coupled between said second output node and said voltage source; and wherein said third and fourth current source are used for providing additional current such that said circuit is able to operate normally when the magnitude of said voltage is reduced.

14. The circuit of claim 13, wherein said resistor unit includes a first resistor coupled to said first output node and a second resistor coupled to said second output node.

15. The circuit of claim 14, wherein the resistance of said first resistor and said second resistor are one-half of said impedance of said UTP cable respectively.

16. In a circuit for a transceiver output port of a local area networking device, said circuit including:

a first and a second output nodes for outputting a differential signal to a network cable;

an equivalent output resistor that matches an impedance of said network cable;

a voltage source for providing a supply voltage;

a first current source coupled between said first output node and ground;

a second current source coupled between said second output node and ground;

a third current source coupled between said first output node and said voltage source; and a fourth current source coupled between said second output node and said voltage source;

wherein said third and said fourth current sources are used for providing an additional current while said first and said second current sources are operating.

17. The circuit of claim 16, wherein said equivalent output resistor comprises a first resistor and a second resistor for matching the impedance of the network cable.

18. The circuit of claim 17, wherein an equivalent resistance value of said first and second resistors is substantially equal to the impedance of said network cable.

19. The circuit of claim 16, wherein said equivalent output resistor is substantially equal to the impedance of the network cable.

20. The circuit of claim 16, wherein said local area networking device is compliant with the Ethernet standard and said network cable is an unshielded twisted pair cable.

* * * * *